(12) United States Patent
Azadet

(10) Patent No.: US 9,935,761 B2
(45) Date of Patent: Apr. 3, 2018

(54) MODELING OF A TARGET VOLTERRA SERIES USING AN ORTHOGONAL PARALLEL WIENER DECOMPOSITION

(71) Applicant: Intel Corporation, Santa Clara, CA (US)

(72) Inventor: Kameran Azadet, Pasadena, CA (US)

(73) Assignee: Intel Corporation, Santa Clara, CA (US)

( * ) Notice: Subject to any disclaimer, the term of this patent is extended or adjusted under 35 U.S.C. 154(b) by 971 days.

(21) Appl. No.: 14/255,499

(22) Filed: Apr. 17, 2014

(65) Prior Publication Data

US 2014/0314182 A1    Oct. 23, 2014

Related U.S. Application Data

(60) Provisional application No. 61/812,858, filed on Apr. 17, 2013.

(51) Int. Cl.
*G06F 7/60* (2006.01)
*G06F 17/10* (2006.01)
(Continued)

(52) U.S. Cl.
CPC ........ *H04L 5/1461* (2013.01); *G06F 9/30036* (2013.01); *G06F 17/15* (2013.01);
(Continued)

(58) Field of Classification Search
CPC ... H04L 5/1461; H04L 27/368; H04L 27/367; H04L 25/03012; H04L 25/03343;
(Continued)

(56) References Cited

U.S. PATENT DOCUMENTS

| 4,673,941 A | 6/1987 | Van Der Mark |
| 4,884,265 A | 11/1989 | Schroeder et al. |

(Continued)

FOREIGN PATENT DOCUMENTS

| EP | 2256937 A1 | 12/2010 |
| KR | 20050064485 A | 6/2005 |

(Continued)

OTHER PUBLICATIONS

Final Office Action received for U.S. Appl. No. 14/230,607, dated Jun. 2, 2016, 17 pages.

(Continued)

*Primary Examiner* — Saif Alhija
(74) *Attorney, Agent, or Firm* — Viering, Jentschura & Partner mbB

(57) ABSTRACT

Improved techniques are provided for modeling a target Volterra series using an orthogonal parallel Weiner decomposition. A target Volterra Series is modeled by obtaining the target Volterra Series V comprised of a plurality of terms up to degree K; providing a parallel Wiener decomposition representing the target Volterra Series V, wherein the parallel Wiener decomposition is comprised of a plurality of linear filters in series with at least one corresponding static nonlinear function, wherein an input signal is applied to the plurality of linear filters and wherein outputs of the nonlinear functions are linearly combined to produce an output of the parallel Wiener decomposition; computing a matrix C. for a given degree up to the degree K, wherein a given row of the matrix C corresponds to one of the linear filters and is obtained by enumerating monomial cross-products of coefficients of the corresponding linear filter for the given degree; and determining filter coefficients for at least one of the plurality of linear filters, such that the rows of the matrix C are linearly independent.

20 Claims, 12 Drawing Sheets

(51) Int. Cl.

| | |
|---|---|
| *H04L 5/14* | (2006.01) |
| *H04L 25/08* | (2006.01) |
| *G06F 17/50* | (2006.01) |
| *H04B 1/62* | (2006.01) |
| *H04L 1/00* | (2006.01) |
| *H04B 1/04* | (2006.01) |
| *G06F 17/15* | (2006.01) |
| *G06F 9/30* | (2018.01) |
| *H04L 25/03* | (2006.01) |
| *H04L 27/36* | (2006.01) |
| *H04J 11/00* | (2006.01) |
| *H04B 1/525* | (2015.01) |

(52) U.S. Cl.
CPC .......... *G06F 17/50* (2013.01); *G06F 17/5009* (2013.01); *H04B 1/0475* (2013.01); *H04B 1/525* (2013.01); *H04B 1/62* (2013.01); *H04J 11/004* (2013.01); *H04L 1/0043* (2013.01); *H04L 25/03012* (2013.01); *H04L 25/03343* (2013.01); *H04L 25/08* (2013.01); *H04L 27/367* (2013.01); *H04L 27/368* (2013.01); *H04B 2001/0425* (2013.01)

(58) Field of Classification Search
CPC ..... H04L 1/0043; H04B 1/525; H04B 1/0475; H04B 1/62; H04J 11/004; G06F 9/30036; G06F 17/5009; G06F 17/50; G06F 17/15
USPC .......................................................... 703/2
See application file for complete search history.

(56) References Cited

U.S. PATENT DOCUMENTS

| | | | |
|---|---|---|---|
| 5,276,633 | A | 1/1994 | Fox et al. |
| 5,381,357 | A | 1/1995 | Wedgwood et al. |
| 5,416,845 | A | 5/1995 | Shen |
| 5,596,600 | A | 1/1997 | Dimos et al. |
| 5,706,314 | A | 1/1998 | Davis et al. |
| 5,896,304 | A | 4/1999 | Tiemann et al. |
| 5,903,611 | A | 5/1999 | Schnabl et al. |
| 5,949,831 | A | 9/1999 | Coker et al. |
| 6,118,832 | A | 9/2000 | Mayrargue et al. |
| 6,150,976 | A | 11/2000 | Cooley |
| 6,151,682 | A | 11/2000 | van der Wal et al. |
| 6,158,027 | A | 12/2000 | Bush et al. |
| 6,163,788 | A | 12/2000 | Chen et al. |
| 6,298,097 | B1 | 10/2001 | Shalom |
| 6,446,193 | B1 | 9/2002 | Alidina et al. |
| 6,496,609 | B1 | 12/2002 | Walter |
| 6,529,925 | B1 | 3/2003 | Schenk |
| 6,574,649 | B2 | 6/2003 | McGrath |
| 6,580,768 | B1 | 6/2003 | Jquette |
| 6,587,514 | B1 | 7/2003 | Wright et al. |
| 6,625,235 | B1 | 9/2003 | Coker et al. |
| 6,643,814 | B1 | 11/2003 | Cideciyan et al. |
| 6,798,843 | B1 | 9/2004 | Wright et al. |
| 6,801,086 | B1 | 10/2004 | Chandrasekaran |
| 7,039,091 | B1 | 5/2006 | Mauer |
| 7,110,477 | B2 | 9/2006 | Suissa et al. |
| 7,133,387 | B2 | 11/2006 | Nakada |
| 7,167,513 | B2 | 1/2007 | Tsui et al. |
| 7,242,725 | B2 | 7/2007 | Matsumoto et al. |
| 7,313,373 | B1 | 12/2007 | Laskharian et al. |
| 7,336,730 | B2 | 2/2008 | Auranen et al. |
| 7,349,375 | B2 | 3/2008 | Gerakoulis |
| 7,441,105 | B1 | 10/2008 | Metzgen |
| 7,471,739 | B1 | 12/2008 | Wright |
| 7,477,634 | B1 | 1/2009 | McKown |
| 7,593,492 | B1 | 9/2009 | Lande |
| 7,606,292 | B1 | 10/2009 | Harris et al. |
| 7,613,228 | B2 | 11/2009 | Niedzwiecki |
| 7,656,837 | B2 | 2/2010 | Gerakoulis |
| 7,869,482 | B2 | 1/2011 | Kubota et al. |
| 7,895,252 | B2 | 2/2011 | Sazegari et al. |
| 7,924,942 | B2 | 4/2011 | Rexberg |
| 8,331,509 | B2 | 12/2012 | Wang et al. |
| 8,516,028 | B2 | 8/2013 | Yu |
| 8,583,152 | B2 | 11/2013 | Ishii et al. |
| 8,711,988 | B2 | 4/2014 | Chen |
| 8,831,133 | B2 | 9/2014 | Azadet et al. |
| 8,897,388 | B2 | 11/2014 | Molina et al. |
| 8,982,992 | B2 | 3/2015 | Azadet et al. |
| 9,225,501 | B2 | 12/2015 | Azadet |
| 2001/0043582 | A1 | 11/2001 | Nakada |
| 2001/0050592 | A1 | 12/2001 | Wright et al. |
| 2001/0050926 | A1 | 12/2001 | Kumar |
| 2002/0057735 | A1 | 5/2002 | Piirainen |
| 2002/0062436 | A1 | 5/2002 | Van Hook et al. |
| 2002/0101835 | A1 | 8/2002 | Gerakoulis |
| 2002/0152248 | A1 | 10/2002 | Bentz |
| 2003/0112904 | A1 | 6/2003 | Fuller et al. |
| 2003/0152165 | A1 | 8/2003 | Kondo et al. |
| 2003/0223505 | A1 | 12/2003 | Verbin et al. |
| 2004/0052314 | A1 | 5/2004 | Copeland |
| 2004/0120420 | A1 | 6/2004 | Hongo et al. |
| 2004/0180679 | A1 | 9/2004 | Porter |
| 2004/0202137 | A1 | 10/2004 | Gerakoulis |
| 2004/0248516 | A1 | 12/2004 | Demir et al. |
| 2005/0001675 | A1 | 1/2005 | Saed |
| 2005/0036575 | A1 | 2/2005 | Kuchi et al. |
| 2005/0108002 | A1 | 5/2005 | Nagai et al. |
| 2005/0111574 | A1 | 5/2005 | Muller et al. |
| 2005/0140438 | A1 | 6/2005 | Jin et al. |
| 2005/0243946 | A1 | 11/2005 | Chung et al. |
| 2006/0029149 | A1 | 2/2006 | Kim et al. |
| 2006/0109938 | A1 | 5/2006 | Challa et al. |
| 2006/0176969 | A1 | 8/2006 | Trivedi |
| 2006/0198466 | A1 | 9/2006 | Wright et al. |
| 2006/0240786 | A1 | 10/2006 | Liu |
| 2007/0005674 | A1 | 1/2007 | Sazegari et al. |
| 2007/0087770 | A1 | 4/2007 | Gan |
| 2007/0189402 | A1 | 8/2007 | Yang |
| 2008/0019422 | A1 | 1/2008 | Smith et al. |
| 2008/0027720 | A1 | 1/2008 | Kondo et al. |
| 2008/0030388 | A1 | 2/2008 | Muck et al. |
| 2008/0095265 | A1 | 4/2008 | Cai et al. |
| 2008/0056403 | A1 | 5/2008 | Wilson |
| 2008/0074155 | A1 | 5/2008 | Jaklitsch |
| 2008/0107046 | A1 | 5/2008 | Kangasmaa et al. |
| 2008/0123770 | A1 | 5/2008 | Copeland |
| 2008/0133982 | A1 | 6/2008 | Rawlins et al. |
| 2008/0144539 | A1 | 6/2008 | Sperlich et al. |
| 2008/0187057 | A1 | 8/2008 | Qu |
| 2008/0192860 | A1 | 8/2008 | Harwood et al. |
| 2008/0219220 | A1 | 9/2008 | Gerakoulis |
| 2008/0247487 | A1 | 10/2008 | Cai et al. |
| 2008/0267261 | A1 | 10/2008 | Wang et al. |
| 2008/0316076 | A1 | 12/2008 | Dent et al. |
| 2009/0006514 | A1 | 1/2009 | Kountouris |
| 2009/0029664 | A1 | 1/2009 | Batruni |
| 2009/0051425 | A1 | 2/2009 | Mehta et al. |
| 2009/0051426 | A1 | 2/2009 | Ba et al. |
| 2009/0079627 | A1 | 5/2009 | Sun et al. |
| 2009/0116576 | A1 | 5/2009 | Dowling |
| 2009/0164542 | A1 | 6/2009 | Wu et al. |
| 2009/0225899 | A1 | 9/2009 | Dent |
| 2009/0245406 | A1 | 10/2009 | Moffatt et al. |
| 2009/0256632 | A1 | 10/2009 | Klingberg et al. |
| 2009/0257421 | A1 | 10/2009 | Nakashima et al. |
| 2009/0285335 | A1 | 11/2009 | Hoshuyama |
| 2010/0027592 | A1 | 2/2010 | Arviv et al. |
| 2010/0067511 | A1 | 3/2010 | Peters |
| 2010/0098139 | A1 | 4/2010 | Braithwaite |
| 2010/0105338 | A1 | 4/2010 | Wang et al. |
| 2010/0124257 | A1 | 5/2010 | Yahya |
| 2010/0138463 | A1 | 6/2010 | Azadet et al. |
| 2010/0138464 | A1 | 6/2010 | Azadet et al. |
| 2010/0138465 | A1 | 6/2010 | Azadet et al. |
| 2010/0138468 | A1 | 6/2010 | Azadet et al. |
| 2010/0144333 | A1 | 6/2010 | Kiasaleh et al. |
| 2010/0158051 | A1 | 6/2010 | Hadzic et al. |
| 2010/0198893 | A1 | 8/2010 | Azadet et al. |

(56) References Cited

U.S. PATENT DOCUMENTS

| | | |
|---|---|---|
| 2010/0198894 A1 | 8/2010 | Azadet et al. |
| 2010/0225390 A1 | 9/2010 | Brown et al. |
| 2010/0244953 A1 | 9/2010 | Brown et al. |
| 2010/0246714 A1 | 9/2010 | Yang et al. |
| 2010/0255867 A1 | 10/2010 | Ishii et al. |
| 2010/0273427 A1 | 10/2010 | Mergen et al. |
| 2010/0316112 A1 | 12/2010 | Huang et al. |
| 2010/0316157 A1 | 12/2010 | Bassam et al. |
| 2011/0002249 A1 | 1/2011 | Gerakoulis |
| 2011/0007907 A1 | 1/2011 | Park et al. |
| 2011/0019724 A1 | 1/2011 | Agazzi |
| 2011/0025414 A1 | 2/2011 | Wolf et al. |
| 2011/0055303 A1 | 3/2011 | Slavin |
| 2011/0059710 A1 | 3/2011 | Cai et al. |
| 2011/0080902 A1 | 4/2011 | Jang |
| 2011/0096824 A1 | 4/2011 | Agazzi et al. |
| 2011/0149714 A1 | 6/2011 | Rimini et al. |
| 2011/0150130 A1 | 6/2011 | Kenington |
| 2011/0170421 A1 | 7/2011 | Gerakoulis |
| 2011/0228828 A1 | 9/2011 | Wang et al. |
| 2011/0255011 A1 | 10/2011 | Gu et al. |
| 2011/0268167 A1 | 11/2011 | Sundström |
| 2011/0302230 A1 | 12/2011 | Ekstrand |
| 2012/0036174 A1 | 2/2012 | Yu |
| 2012/0087406 A1 | 4/2012 | Lim et al. |
| 2012/0093209 A1 | 4/2012 | Schmidt et al. |
| 2012/0106614 A1 | 5/2012 | Kim et al. |
| 2012/0188994 A1 | 7/2012 | Palanki et al. |
| 2012/0269292 A1 | 10/2012 | Wang et al. |
| 2012/0269293 A1 | 10/2012 | Peng et al. |
| 2012/0280840 A1 | 11/2012 | Kyeong et al. |
| 2012/0295657 A1 | 11/2012 | Okazaki |
| 2013/0007082 A1 | 1/2013 | Elenes |
| 2013/0022157 A1 | 1/2013 | Hollevoet et al. |
| 2013/0044794 A1 | 2/2013 | Wenzel et al. |
| 2013/0070867 A1 | 3/2013 | To et al. |
| 2013/0114652 A1 | 5/2013 | Molina et al. |
| 2013/0114761 A1 | 5/2013 | Azadet et al. |
| 2013/0114762 A1 | 5/2013 | Azadet et al. |
| 2013/0117342 A1 | 5/2013 | Azadet et al. |
| 2013/0195007 A1 | 8/2013 | Mazurenko et al. |
| 2013/0243123 A1 | 9/2013 | Bai |
| 2014/0016626 A1 | 1/2014 | Dai et al. |
| 2014/0064417 A1 | 3/2014 | Azadet |
| 2014/0072073 A1 | 3/2014 | Azadet et al. |
| 2014/0075162 A1 | 3/2014 | Azadet et al. |
| 2014/0086356 A1 | 3/2014 | Azadet et al. |
| 2014/0086361 A1 | 3/2014 | Azadet et al. |
| 2014/0086367 A1 | 3/2014 | Azadet et al. |
| 2014/0108477 A1 | 4/2014 | Azadet et al. |
| 2014/0218107 A1 | 8/2014 | Geng et al. |
| 2014/0313946 A1 | 10/2014 | Azadet |
| 2014/0314176 A1 | 10/2014 | Azadet |
| 2014/0314181 A1 | 10/2014 | Azadet |
| 2014/0314182 A1 | 10/2014 | Azadet |
| 2014/0316752 A1 | 10/2014 | Azadet |
| 2014/0317163 A1 | 10/2014 | Azadet et al. |
| 2014/0317376 A1 | 10/2014 | Azadet |
| 2015/0070089 A1 | 3/2015 | Eliaz et al. |
| 2015/0146822 A1 | 5/2015 | Copeland |

FOREIGN PATENT DOCUMENTS

| | | |
|---|---|---|
| WO | 2007010331 A1 | 1/2007 |
| WO | 2007104362 A1 | 9/2007 |
| WO | 2008057584 A2 | 5/2008 |
| WO | 2011/058843 A1 | 5/2011 |
| WO | 2011/101233 A1 | 8/2011 |
| WO | 2013007188 A1 | 1/2013 |
| WO | 2013/063434 A1 | 5/2013 |
| WO | 2013/063440 A1 | 5/2013 |
| WO | 2013/063443 A1 | 5/2013 |
| WO | 2013/063447 A1 | 5/2013 |
| WO | 2013/063450 A1 | 5/2013 |
| WO | 2013/066756 A1 | 5/2013 |

OTHER PUBLICATIONS

Non final Office Action received for U.S. Appl. No. 14/230,607, dated Nov. 19, 2015, 15 pages.

"Bilinear interpolation", [Online] retrieved from the Internet <https:web.archive.org/web/20110921104425/http://en.wikipedia.org/wiki/Bilinear_interpolation>, (Sep. 21, 2011).

Jin, Minglu, et al., "A fast LUT predistorter for power amplifier in OFDM sytems", in Personal, Indoor and Mobile Radio Communications, 2003, PIMRC 2003, 14th IEEE Proceedings on, vol. 2, No.,(Sep. 7-13, 2003), 1894-1897.

Li, Hao, et al., "A Fast Digital Predistortion Algorithm for Radio-Frequency Power Amplifier Linearization With Loop Delay Compensation", in Selected Topics in Signal Processing, IEEE Journal of, vol. 3, No. 3, (Jun. 2009), 374-383.

Lu, Chao, et al., "A 24.7 dBm all-digital RF transmitter for multimode broadband application sin 40nm CMOS", in Solid-State Circuits Conference Digest of Technical Papers (ISSCC), 2013 IEEE International, vol., No., (Feb. 17-21, 2013), 332-333.

Nagata, Y "Linear amplification technique for digital mobile communications", in Vehicular Technology Conference, 1989, IEEE 39th, vol., No. 1, (May 1989), 159-164.

Non final Office Action received for U.S. Appl. No. 14/230,635, dated Dec. 4, 2015, 16 pages.

Final Office Action received for U.S. Appl. No. 14/230,635, dated Jun. 30, 2016, 13 pages.

Non final Office Action received for U.S. Appl. No. 14/255,491, dated Jun. 16, 2016, 10 pages.

Notice of Allowance received for U.S. Appl. No. 12/849,142, dated Apr. 26, 2013, 6 pages.

Advisory Action received for U.S. Appl. No. 14/230,607, dated Aug. 12, 2013, 3 pages.

Non final Office Action received for U.S. Appl. No. 12/849,142, dated Jan. 4, 2015, 6 pages.

Wegener, A.: "High-Performance Crest Factor Reduction Processor for W-CDMA and OFDM Applications", Radio Frequency Integrated Circuits (RFIC) Symposium, Jun. 2006, 4 pages, IEEE, USA.

Gopalan, R. et al.: "An Optimization Approach to Single-Bit Quantization", IEEE Transactions on Circuits and Systems I: Regular Papers, Dec. 2009, pp. 2655-2668, vol. 56, Issue 12, IEEE, USA.

Gopalan, R. et al.: "On an optimum algorithm for waveform synthesis and its applications to digital transmitters", Wireless Communications and Networking Conference, Mar. 2005, pp. 1108-1113, vol. 2, IEEE, USA.

Venkatamaran, J. et al.: "An All-Digital Transmitter with a 1-Bit DAC", IEEE Transactions on Communications, Oct. 2007, pp. 1951-1962, vol. 55, Issue 10, IEEE, USA.

European Search Report received for the corresponding EP application No. EP 12 84 3913.0, dated Jul. 9, 2015, 7 pages.

European Search Report received for the corresponding EP application No. EP 12 84 2850.5, dated Jun. 25, 2015, 5 pages.

Notice of Allowance received for U.S. Appl. No. 13/566,146, dated Feb. 12, 2016, 5 pages.

Notice of Allowance received for U.S. Appl. No. 14/168,615 dated Feb. 4, 2016, 7 pages.

Corrected Notice of Allowability for U.S. Appl. No. 14/168,615, dated Feb. 24, 2016, 2 pages.

Li, "FIR Filtering Using Vector Transformation and Convolution Processor", 1990, IEEE, pp. 1223-1226.

Gopalan et al., "An Optimization Approach to Single-Bit Quantization", IEEE Transactions on Circuits and Systems—I: Regular Papers, vol. 56, No. 12, Dec. 2009, pp. 2655-2668

Venkataraman et al., "An All-Digital Transmitter with a 1-Bit DAC", IEEE Transactions on Communications, vol. 55, No. 10, Oct. 2007, pp. 1951-1962.

Office action received for U.S. Appl. No. 13/661,295, dated Feb. 28, 2014, 8 pages.

Notice of Allowance received for U.S. Appl. No. 13/661,295, dated Aug. 4, 2014, 7 pages.

Office action received for U.S. Appl. No. 13/661,351, dated May 23, 2014, 32 pages.

Office action received for U.S. Appl. No. 13/661,351, dated Nov. 14, 2014, 28 pages.

(56) References Cited

OTHER PUBLICATIONS

Office action received for U.S. Appl. No. 13/661,351, dated Mar. 26, 2015, 39 pages.
Office action received for U.S. Appl. No. 13/661,355, dated Jun. 4, 2015, 17 pages.
Office action received for U.S. Appl. No. 13/661,355, dated Feb. 6, 2015, 14 pages.
Office action received for U.S. Appl. No. 13/661,355, dated Sep. 25, 2014, 12 pages.
Office action received for U.S. Appl. No. 13/661,357, dated Oct. 18, 2013, 7 pages.
Notice of Allowance received for U.S. Appl. No. 13/661,357, dated May 13, 2014, 6 pages.
Office action received for U.S. Appl. No. 13/701,369, dated Jun. 24, 2014, 16 pages.
Office action received for U.S. Appl. No. 13/701,374, dated May 29, 2015, 7 pages.
Office action received for U.S. Appl. No. 13/701,384, dated Dec. 31, 2014, 21 pages.
Office action received for U.S. Appl. No. 13/701,415, dated Aug. 1, 2014, 11 pages.
Notice of Allowance received for U.S. Appl. No. 13/701,415, dated Nov. 20, 2014, 5 pages.
Office action received for U.S. Appl. No. 14/090,555, dated Nov. 17, 2014, 20 pages.
Office action received for U.S. Appl. No. 13/701,384, dated Jul. 16, 2015, 21 pages.
Office action received for U.S. Appl. No. 14/230,622, dated Apr. 14, 2015, 22 pages.
Notice of Allowance received for U.S. Appl. No. 14/230,622, dated Aug. 28, 2015, 13 pages.
Notice of Allowance received for U.S. Appl. No. 14/090,555, dated Aug. 12, 2014, 8 pages.
Office action received for U.S. Appl. No. 13/701,376, dated Jul. 22, 2015, 9 pages.
Office action received for U.S. Appl. No. 13/701,397, dated Jul. 30, 2015, 15 pages.
Office action received for U.S. Appl. No. 13/566,146, dated Jan. 29, 2015, 6 pages.
Notice of Allowance received for U.S. Appl. No. 13/566,146, dated Jun. 1, 2015, 13 pages.
Supplementary European Search Report for EP Patent Application No. EP12846556, dated Jun. 24, 2015, 6 pages.
Supplementary European Search Report for EP Patent Application No. EP12843512, dated Jun. 2, 2015, 6 pages.
Supplementary European Search Report for EP Patent Application No. EP12842850, dated Jun. 25, 2015, 4 pages.
Supplementary European Search Report for EP Patent Application No. EP12843913, dated Jul. 9, 2015, 6 pages.
Final Office Action received for U.S. Appl. No. 13/661,351, dated Sep. 10, 2015, 15 pages of office action.
Non-final Office Action received for U.S. Appl. No. 13/701,374, dated Aug. 24, 2015, 8 pages of office action.
Notice of Allowance received for U.S. Appl. No. 14/090,555, dated Aug. 12, 2015, 8 pages.
International search report received for corresponding International Application No. PCT/EP2016/056810 dated Nov. 29, 2016, 15 pages.
Office Action received for corresponding U.S. Appl. No. 14/230,607 dated Oct. 7, 2016, 22 pages.
Kim et al., "Piecewise Pre-Equalized Linearization of the Wireless Transmitter With a Doherty Amplifier", IEEE Transactions on Microwave Theory and Techniques, 2006, pp. 3469-3478, vol. 54, No. 9.
Office Action received for the U.S. Appl. No. 14/230,607, dated Apr. 21, 2017, 29 pages.
Advisory Action received for the U.S. Appl. No. 14/230,607, dated Jul. 12, 2017, 3 pages.
Office Action received for the U.S. Appl. No. 15/191,583, dated Aug. 11, 2017, 17 pages.
Lei Ding, "Digital Predistortion of Power Amplifiers for Wireless Applications", School of Electrical and Computer Engineering Georgia Institute of Technology PhD thesis, Mar. 2004.
Maarten Schoukens et al., "Parametric Identification of Parallel Wiener Systems", IEEE Transactions on Instrumentation and Measurement, Oct. 2012, pp. 2825-2832, vol. 61, No. 10, IEEE.
Non-Final Office Action received for the U.S. Appl. No. 14/230,607, dated Sep. 7, 2017, 31 pages.

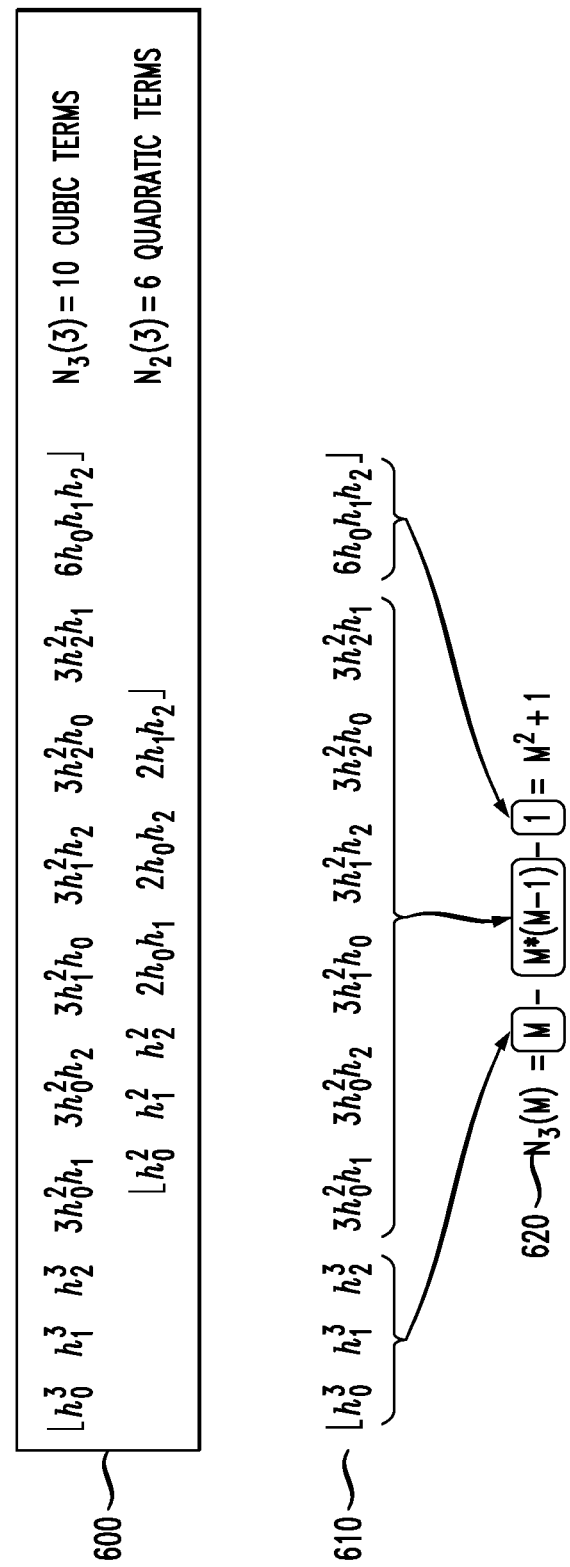

$$[\,|h_0|^2\ h_0\ |h_1|^2\ h_1\ |h_2|^2\ h_2\ |h_0|^2\ h_1\ h_0^*h_1\ |h_0|^2\ h_2\ h_0^*h_2\ |h_1|^2\ h_0\ h_1^*h_0^*\ |h_1|^2\ h_2\ h_1^*h_2^*\ |h_2|^2\ h_0\ h_2^*h_0^*\ |h_2|^2\ h_1\ h_2^*h_1^*\ 2h_0^*h_1h_2\ 2h_0h_1^*h_2\ 2h_0h_1h_2^*\,] \sim 1100$$

$1120 \sim N_3(M) = \boxed{M} + \boxed{2M(M-1)} + \boxed{M} = 2M^2$

$$h(0\ldots5,\cdot) = \begin{bmatrix} 1 & 0 & 0 \\ 1 & 0 & 0 \\ 1 & j & 0 \\ 1 & -0.5 & j \\ 1 & 0 & -0.5 \\ 1 & 0.25 & j \end{bmatrix}$$

$$h(6\ldots11,\cdot) = \begin{bmatrix} 0 & 1 & 0 \\ 0 & 1 & 1 \\ 0 & 1 & j \\ j & 1 & -0.5 \\ -0.5 & 1 & 0 \\ j & 1 & 0.25 \end{bmatrix}$$

$$h(12\ldots17,\cdot) = \begin{bmatrix} 1 & 0 & 1 \\ j & 0 & 1 \\ -0.5 & j & 1 \\ 0 & -0.5 & 1 \\ 0 & 0 & 1 \\ 0.25 & j & 1 \end{bmatrix}$$

$\det(C_3) \approx -107 j \neq 0$
$\mathrm{cond}(C_3) \approx 26$

FIG. 14

1410 — $\begin{bmatrix} 1 & 0 & 1 \\ 1 & 1 & j \\ 1 & j & -0.5 \\ 0 & 1 & 0 \\ j & 1 & 0 \\ -0.5 & 1 & 1 \end{bmatrix}$ $[1\ 0\ 0\ 0\ 0\ 0]$ — 1420-1
$[1\ j\ j\ -j\ 1\ -1]$ — 1420-2
$[1\ -0.125\ -0.5\ -0.5\ 0.25\ 0.25]$ — 1420-3
$[0\ 1\ 0\ 0\ 0\ 0]$ — 1420-4
$[j\ 1\ 1\ -1\ j\ -1]$ — 1420-5
$[-0.125\ 1\ 0.25\ -0.5\ -0.5]$ — 1420-6

$\det(C) = -1.1250 + j0.3750 \neq 0$ — 1430

MODELING OF A TARGET VOLTERRA SERIES USING AN ORTHOGONAL PARALLEL WIENER DECOMPOSITION

CROSS-REFERENCE TO RELATED APPLICATIONS

The present application claims priority to U.S. Patent Provisional Application Ser. No. 61/812,858, filed Apr. 17, 2013, entitled "Digital Front End (DFE) Signal Processing," incorporated by reference herein.

The present application is related to U.S. patent application Ser. No. 14/168,621, filed Jan. 30, 2014, entitled "Non-Linear Modeling of a Physical System Using Direct Optimization of Look-Up Table Values;" PCT Patent Application No. PCT/US12/62179, filed Oct. 26, 2012, entitled "Software Digital Front End (SoftDFE) Signal Processing;" and PCT Patent Application No. PCT/US 12/62186, filed Oct. 26, 2012, entitled "Processor Having Instruction Set with User-Defined Non-Linear Functions for Digital Pre-Distortion (DPD) and Other Non-Linear Applications," each incorporated by reference herein.

FIELD OF THE INVENTION

The present invention is related to digital signal processing techniques and, more particularly, to techniques for modeling non-linear systems.

BACKGROUND OF THE INVENTION

Power amplifiers 1508 are an important component in many wireless communication systems 1500, but they often introduce non-linearity. Digital pre-distortion (DPD) is a technique used to linearize a power amplifier 1508 in a transmitter to improve the efficiency of the power amplifier 1508. A digital pre-distortion circuit 1504 inversely models the gain and phase characteristics of the power amplifier 1508 and, when combined with the amplifier 1508, produces an overall system that is more linear and reduces distortion than would otherwise be caused by the power amplifier 1508. An inverse distortion is introduced into the input 1506 of the amplifier 1508, thereby reducing any non-linearity that the amplifier 1508 might otherwise exhibit. When developing an effective DPD 1504, it is often challenging to capture the nonlinear distortion and memory effects of the power amplifier 1508 using an accurate behavioral model.

Volterra series have been used to model the non-linear behavior of a non-linear system, such as a DPD system 1504 or a power amplifier 1508. Among other benefits, a Volterra series can capture the memory effects of the modeled non-linear system. The Volterra series can be used to approximate the response of a non-linear system to a given input 1502 when the output 1510 of the non-linear system depends on the input to the system at various times. Volterra series are thus used to model non-linear distortion in a wide range of devices including power amplifiers 1508.

Due to the complexity of a Volterra series, however, such as a large number of coefficients, the Volterra series is often modeled using a generalized memory polynomial (GMP) model, which reduces complexity by pruning the Volterra series to a reduced number of terms. Thus, GMP is a simplification of an ideal Volterra series. Pruning of terms can result in loss of performance in some cases. A need remains for improved techniques for modeling a target Volterra series.

SUMMARY OF THE INVENTION

Generally, improved techniques are provided for modeling a target Volterra series using an orthogonal parallel Weiner decomposition. According to one aspect of the invention, a target Volterra Series is modeled by obtaining the target Volterra Series V comprised of a plurality of terms up to degree K; providing a parallel Wiener decomposition representing the target Volterra Series V, wherein the parallel Wiener decomposition is comprised of a plurality of linear filters in series with at least one corresponding static non-linear function, wherein an input signal is applied to the plurality of linear filters and wherein outputs of the non-linear functions are linearly combined to produce an output of the parallel Wiener decomposition; computing a matrix C for a given degree up to the degree K, wherein a given row of the matrix C corresponds to one of the linear filters and is obtained by enumerating monomial cross-products of coefficients of the corresponding linear filter for the given degree; and determining filter coefficients for at least one of the plurality of linear filters, such that the rows of the matrix C are linearly independent.

In addition, a vector A is computed comprising coefficients that perform the linear combination of the outputs of the plurality of static non-linear functions. At least one of the static non-linear functions are determined based on the vector A. The vector A can be obtained by multiplying the target Volterra Series V by an inverse of the matrix C.

Another aspect of the invention recognize that a number of the DC, linear, quadratic and cubic terms can share one or more filters and/or look-up tables (LUTs). Thus, one or more of the plurality of linear filters can be shared by a plurality of degrees of the representation of the target Volterra Series V. In another variation, one or more of the static non-linear functions are shared by a plurality of degrees of the representation of the target Volterra Series V.

The filter coefficients for at least one of the plurality of linear filters can be determined by evaluating a linear independence of the rows of the matrix C. For example, the filter coefficients can be determined by evaluating a condition number of the matrix C.

According to yet another aspect of the invention, at least one of the static non-linear functions is implemented using at least one look-up table. The look-up table comprises entries obtained, for example, by evaluating a mean square error. The look-up table entries can be obtained, for example, using one or more of a least squares algorithm, recursive least squares (RLS) and least mean square (LMS). Linear interpolation can be employed between two consecutive values of the at least one look-up table to approximate the at least one static non-linear function.

A more complete understanding of the present invention, as well as further features and advantages of the present invention, will be obtained by reference to the following detailed description and drawings.

BRIEF DESCRIPTION OF THE DRAWINGS

FIGS. 5A and 5B illustrate an exemplary Volterra Series V up to degree K=3 and a memory depth of three;

FIG. 6 illustrates the set of monomial cross-products for quadratic and cubic degrees;

FIGS. 10A and 10B illustrate an exemplary Volterra Series V up to degree K=3 and a memory depth of three for complex signals;

FIG. 11 illustrates a computation of a number of cubic terms for a set of monomial cross-products up to cubic degree, corresponding to the reduced set of terms of FIG. 10;

FIGS. 12A and 12B illustrate exemplary matrices H;

FIG. 13 illustrates an exemplary selection of filter coefficients for up to cubic non-linearity; and FIG. 14 illustrates an exemplary selection of filter coefficients for up to quadratic non-linearity.

DETAILED DESCRIPTION

Aspects of the present invention provide improved techniques for modeling a target Volterra series using an orthogonal parallel Weiner decomposition. Generally, a parallel Weiner decomposition comprises a linear combination of a plurality of linear filters in series with a corresponding static non-linear function. According to one aspect of the invention, discussed further below, techniques are provided for determining filter coefficients for the linear filters using a matrix C, such that the rows of the matrix C containing non-linear cross-products of coefficients of a corresponding filter, are linearly independent. In this manner, a target Volterra series can be reconstructed by a linear combination of the output of the static non-linear functions that process the filtered outputs.

For a more detailed discussion of non-linearity issues, DPD and parallel Wiener systems, see, for example, Lei Ding, "Digital Predistortion of Power Amplifiers for Wireless Applications," Georgia Tech, PhD Thesis, downloadable from https://smartech.gatech.edu/xmlui/bitstream/handle/1853/5184/ding_lei_200405_phd .pdf (March 2004); or M. Schoukens and Y. Rolain, "Parametric Identification of Parallel Wiener Systems" IEEE Trans. on Instrumentation and Measurement (October 2012) each incorporated by reference herein.

Figure 1:
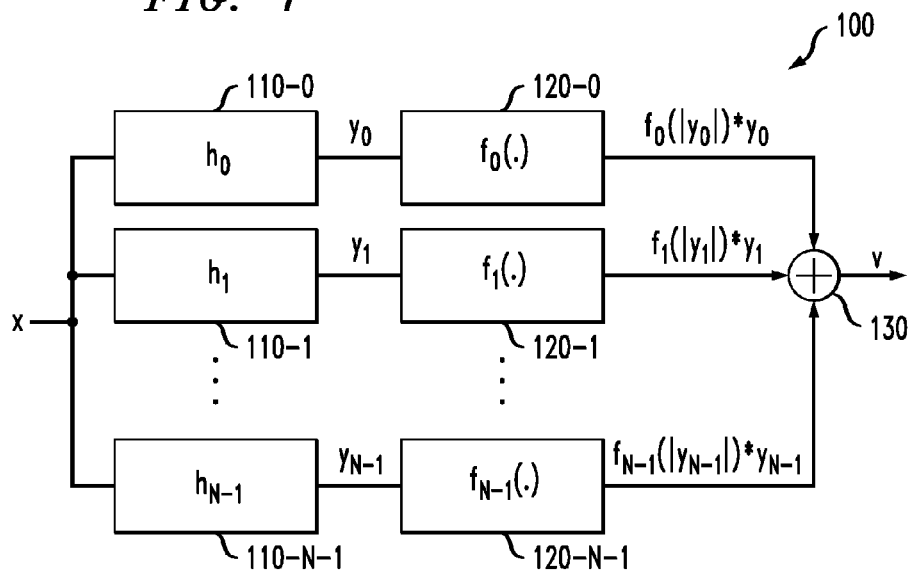
FIG. 1 is a schematic block diagram of an exemplary parallel Wiener decomposition that incorporates features of the present invention.

FIG. 1 is a schematic block diagram of an exemplary parallel Weiner decomposition 100 that incorporates features of the present invention. As shown in FIG. 1, the exemplary parallel Weiner decomposition 100 includes a plurality of linear filters 110-0 through 110-N-1 in series with a corresponding static non-linear function 120-0 through 120-N-1. An exemplary adder 130 performs a linear combination of the outputs of the static non-linear functions 120. The static non-linear functions 120 may be implemented, for example, using look-up tables, in a known manner.

As discussed hereinafter, aspects of the present invention recognize that a Volterra series of a given order and memory depth has an equivalent representation with the parallel Wiener decomposition 100 of FIG. 1. The construction of the filter coefficients is discussed further below in conjunction with FIG. 3.

Figure 2:
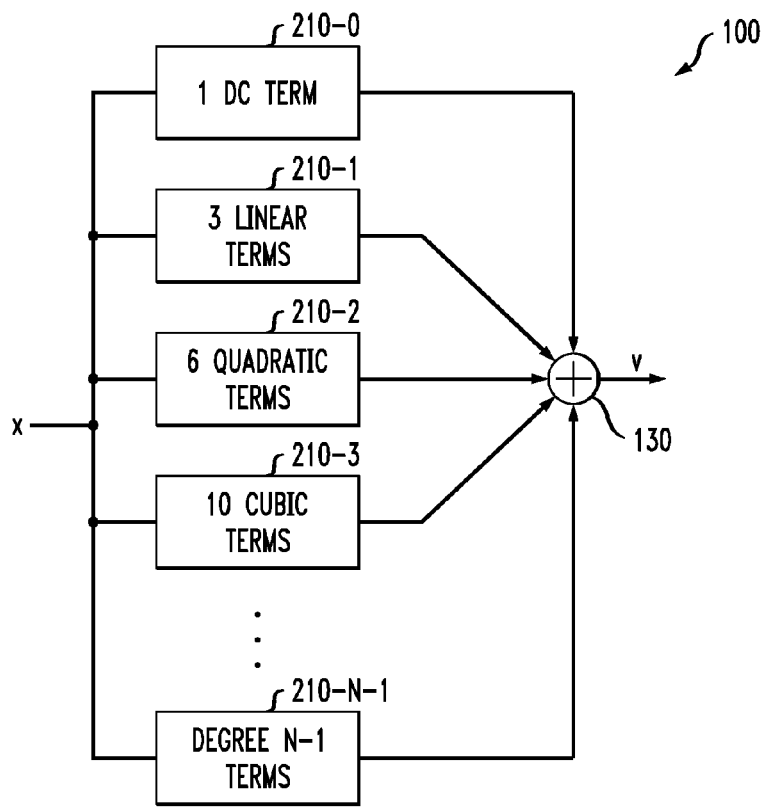
FIG. 2 illustrates the exemplary parallel Weiner decomposition of FIG. 1 in further detail.

FIG. 2 illustrates the exemplary parallel Weiner decomposition 100 of FIG. 1 in further detail. As shown in FIG. 2, a target Volterra series can be expressed as a sum of terms of various degrees, up to a target degree K. In the exemplary embodiment of FIG. 2, the exemplary target Volterra series is expressed as a sum of DC terms 210-0, linear terms 210-1, quadratic terms 210-2, cubic terms 210-3 and optionally additional terms up to order N-1. For an exemplary memory depth of three, it can be shown that there are one DC term 210-0, three linear terms 210-1, six quadratic terms 210-2 and 10 cubic terms 210-3. Thus, the total number coefficients to be computed is one plus the number of linear coefficients plus the number of quadratic coefficients plus the number of cubic coefficients (1+3+6+10=20).

As discussed further below in conjunction with FIGS. 8 and 9, additional aspects of the invention recognize that a number of the DC, linear, quadratic and cubic terms can share one or more filters and/or look-up tables (LUTs). Thus, an exemplary embodiment comprises a total of 10 filters and LUTs (limited by number of highest degree term, here cubic terms).

Construction of the Proposed Parallel Wiener Model

Suppose the target Volterra series of memory depth 3 has the following quadratic terms: $v_{2,0}x_n^2+v_{2,1}x_{n-1}^2+v_{2,2}x_{n-2}^2+v_{2,3}x_nx_{n-1}+v_{2,4}x_nx_{n-2}+v_{2,5}x_{n-1}x_{n-2}$.

We define the quadratic coefficients in a vector form as:

$V_2=[v_{2,0}\ v_{2,1}\ v_{2,2}\ v_{2,3}\ v_{2,4}\ v_{2,5}]$

In this example there are $N_2=6$ quadratic terms. We select $N_2$ filters, and define $C_2$ where each row is of the form: $[h_0^2\ h_1^2\ h_2h_2\ 2h_0h_1\ 2h_0h_2\ 2h_1h_2]$, where $h_0$, $h_1$, $h_2$ are the coefficients of a corresponding filter, and such that the determinant $\det(C_2)$ is non-zero (rows of $C_2$ are linearly independent). Thus, there exist coefficients $a_2(0), \ldots, a_2(5)$ such that:

$$V_2 = \sum_{k=0}^{N_2-1} a_{2,k} C_2(k,.)$$

This can be written in a matrix form:

$V_2 = A_2 C_2$

The coefficients are given by:

$A_2 = V_2 C_2^{-1}$

Similarly, the Volterra cubic terms can be obtained using coefficients $a_3(.)$, as follows:

$$V_3 = \sum_{k=0}^{N_3-1} a_{3,k} C_3(k,.) \qquad (1)$$

$V_3 = A_3 C_3$ $$A_3 = V_3 C_3^{-1} \qquad (2)$$

The Volterra series can be written as:

$$V = V_0 X_0^T + V_1 X_1^T + V_2 X_2^T + V_3 X_3^T + \ldots =$$

$$\sum_{i=0}^{K} V_i X_i^T = \sum_{i=0}^{K} \sum_{k=0}^{N_i-1} a_{i,k} C_i(k,.) X_i^T = \sum_{i=0}^{K} \sum_{k=0}^{N_i-1} a_{i,k} (H(k,.) X^T)^i$$

where K is the highest degree of the target Volterra series and $X_0=1$, $X_1=[x_n \; x_{n-1} \; x_{n-2}]$, $X_2=[x_n^2 \; x_{n-1}^2 \; x_{n-2}^2 \; x_n x_{n-1} \; x_n x_{n-2} \; x_{n-1} x_{n-2}]$, and $X_3=[x_n^3 \; x_{n-1}^3 \; x_{n-2}^3 \; x_n^2 x_{n-1} \; x_n^2 x_{n-1} \; x_{n-1}^2 x_n$
$x_{n-1}^2 x_{n-2} \; x_{n-2}^2 x_n \; x_{n-2}^2 x_{n-1} \; x_n x_{n-1} x_{n-2}]$ The filter coefficients can be expressed as follows:

$H(k,.)=[h_{k,0} \; h_{k,1} \; h_{k,2}]$

Therefore:

$$V = \sum_{i=0}^{K} \sum_{k=0}^{N_i-1} a_{i,k} y_k^i$$

$$= \sum_{k=0}^{N_k-1} \left( \sum_{i=0}^{K} a_{i,k} y_k^i \right)$$

$$= \sum_{k=0}^{N_k-1} f_k(y_k)$$

where the static polynomial function can be expressed as follows:

$$f_k(y) = \sum_{i=0}^{K} a_{i,k} y^i$$

It is noted that for $k > N_i$, $a_{i,k}=0$.

Figure 3:
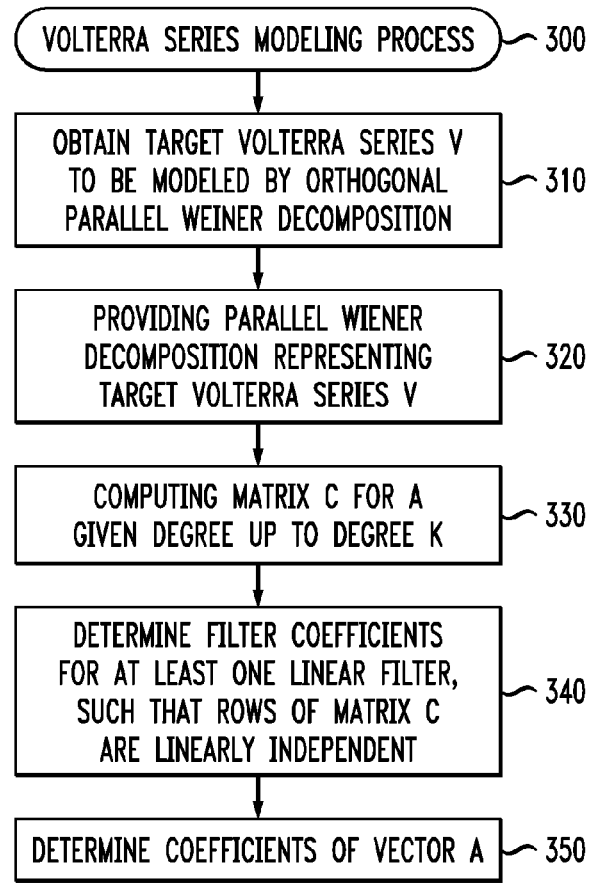
FIG. 3 is a flow chart illustrating an exemplary implementation of the Volterra series modeling process incorporating aspects of the present invention.

Thus, for a given H, the target Volterra series has an equivalent representation as a parallel Weiner decomposition 100, as shown in FIG. 1:

FIG. 3 is a flow chart illustrating an exemplary implementation of the Volterra series modeling process 300 incorporating aspects of the present invention. Generally, the exemplary Volterra series modeling process 300 computes the filter coefficients H, the matrix C and the vector A for each degree of the target Volterra series.

As shown in FIG. 3, the exemplary Volterra series modeling process 300 initially obtains the target Volterra Series V to be Modeled by the disclosed orthogonal parallel Weiner decomposition during step 310. The target Volterra Series V is given (i.e., the coefficients of the Volterra series for DC, linear, quadratic, cubic degrees, etc. up to degree K).

During step 320, the exemplary Volterra series modeling process 300 provides the parallel Wiener decomposition representing the target Volterra Series V. As discussed above in conjunction with FIG. 1, the exemplary parallel Wiener decomposition is comprised of a linear combination of a plurality of linear filters 110 each in series with at least one corresponding static non-linear function 120.

For each degree k, $0<=k<=K$ of V, the exemplary Volterra series modeling process 300 then computes the filter coefficients 11, the matrix C and the vector A for each degree of the target Volterra series as follows. Thus, the matrix C and the vector A are specific to a monomial degree k.

During step 330, the exemplary Volterra series modeling process 300 computes the matrix $C_k$ for a given degree up to said degree K, where the rows of $C_k$ are all of the degree k monomial cross-products of a corresponding filter's coefficients. A given row of the matrix C corresponds to one of the linear filters and is obtained by enumerating the monomial cross-products of the coefficients of the corresponding linear filter for the given degree. The monomial cross-products are discussed further below, for example, in conjunction with FIGS. 6 and 11. See also, a discussion of monomial terms on Wikipedia.org (http://en.wikipedia.org/wiki/Monomial).

In one exemplary embodiment, the matrix C is a square matrix (i.e., having the same number of rows and columns). The number of columns in the matrix C is equal to the number of the highest order monomial coefficients in the Volterra series, and the number of rows is equal to number of Volterra coefficients.

In one exemplary embodiment, for a given degree, the coefficients H are chosen randomly, and for each row of H, a corresponding row of C is given by all possible monomial cross-products of degree K (total N(K) terms)), producing a matrix C with N(K) rows and columns. In this manner, the filter coefficients are obtained during step 340 for at least one linear filter, such that the rows of the matrix C are linearly independent. The rows of C are evaluated to ensure that they are linearly independent (C is invertible). If the rows of C are not linearly independent, the iteration (K) is repeated.

For example, for an exemplary Volterra Series V comprised of a plurality of terms up to degree K=3, the cubic monomials with real numbers are of the form:

$x_1^{k1} x_2^{k2} x_3^{k3}$, such that $k1+k2+k3=3$.

For example, as discussed below, in a similar way the monomial terms of degree two and a memory depth of two, with complex numbers, can be expressed as follows:

$[|h_0|^2 h_0 \; |h_1|^2 h_1 \; |h_0|^2 h_1 \; h_0^2 h_1^* \; |h_1|^2 h_0 \; h_1^2 h_0^*]$.

The coefficients of vector A are computed during step 350, such that after linearly combining the rows of the matrix C with the coefficients of vector A, the corresponding degree K Volterra series terms are obtained from the target Volterra series V.

Basic Idea

Consider an exemplary Volterra Series V comprised of a plurality of terms up to degree K=2 (i.e., quadratic nonlinearity) and a memory depth of two. The Volterra series can be expressed as follows:

$(h_0 x(n)+h_1 x(n-1))^2 = h_0^2 x^2(n)+h_1^2 x^2(n-1)+2h_0 h_1 x(n)x(n-1)$

Assume that the filter coefficients have the following exemplary values:

$$H = \begin{bmatrix} 1 & 1 \\ 1 & 0.5 \\ 1 & -0.5 \end{bmatrix} \quad (3)$$

Assume further that the target Volterra quadratic term is:

$V_2 = 0.1 \cdot x^2(n) - 0.2 \cdot x^2(n-1) + 0.3 \cdot x(n)x(n-1)$

Thus, the coefficients of the target Volterra quadratic term can be expressed in a vector format, as follows:

$v_2 = [0.1\ -0.2\ 0.3]$

There are three independent quadratic terms in the Volterra series. Aspects of the present invention recognize that three sets of filter coefficients h can be used to reconstruct the target Volterra series $v_2$ by a linear combination of the simple square terms:

$(x(n)+x(n-1))^2 = x^2(n) + x^2(n-1) + 2x(n)x(n-1)$ $(x(n)+0.5 \cdot x(n-1))^2 = x^2(n) + 0.25 \cdot x^2(n-1) + x(n)x(n-1)$ $(x(n)-0.5 \cdot x(n-1))^2 = x^2(n) + 0.25 \cdot x^2(n-1) - x(n)x(n-1)$ This system of equations can be represented by the matrix C (having linearly independent rows), as follows:

$$C_2 = \begin{bmatrix} 1 & 1 & 2 \\ 1 & 0.25 & 1 \\ 1 & 0.25 & -1 \end{bmatrix}$$

According to equation (1), the components of matrix C can be multiplied by the components of vector A to obtain the target Volterra series $v_2$.

According to equation (2), the components of the vector A can be obtained as follows:

$a_2 = v_2 \cdot C_2^{-1} = [-0.3\ 0.65\ -0.25]$ \hfill (4)

It can be verified that the linear combination of the parallel Weiner decomposition results in the target Volterra series:

$-0.3(x(n)+x(n-1))^2 + 0.65(x(n)+0.5 \cdot x(n-1))^2 - 0.25(x(n)-0.5 \cdot x(n-1))^2 = 0.1 \cdot x^2(n) - 0.2 \cdot x^2(n-1) + 0.3 \cdot x(n)x(n-1)$ \hfill (5)

Figure 4:
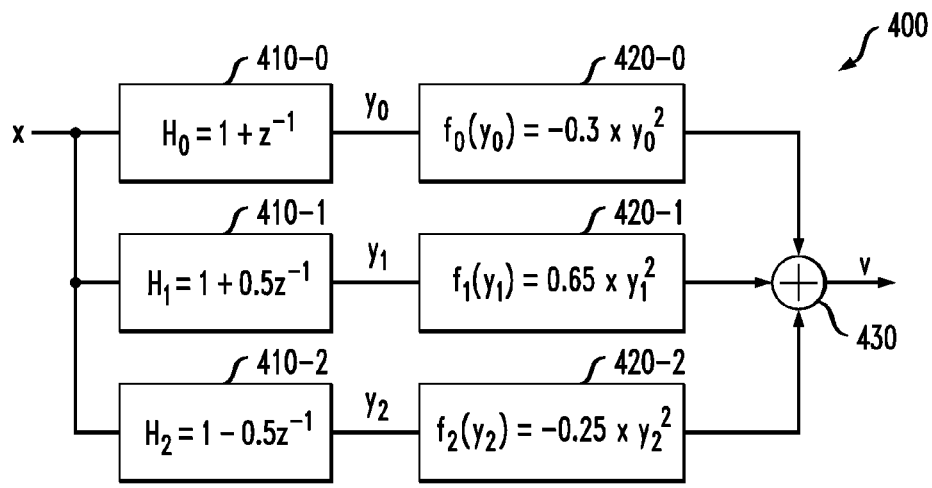
FIG. 4 illustrates an exemplary parallel Weiner decomposition for exemplary filter coefficients and an exemplary vector A.

FIG. 4 illustrates an exemplary parallel Weiner decomposition 400 for the exemplary filter coefficients of equation (3) and the exemplary vector A of equation (4). As shown in FIG. 4, the exemplary parallel Weiner decomposition 400 comprises three two tap linear filters 410-0 through 410-2 and three corresponding static non-linear functions 420-0 through 420-2. As noted above, in one exemplary embodiment, the static non-linear functions 420 are implemented as look-up tables. An exemplary adder 430 performs a linear combination of the outputs of the static non-linear functions 420.

The output v of the parallel Weiner decomposition 400 can be expressed as follows, corresponding to equation (5):

$v(n) = 0.1 \cdot x^2(n) - 0.2 \cdot x^2(n-1) + 0.3 \cdot x(n)x(n-1)$.

Figures 5A, 5B:
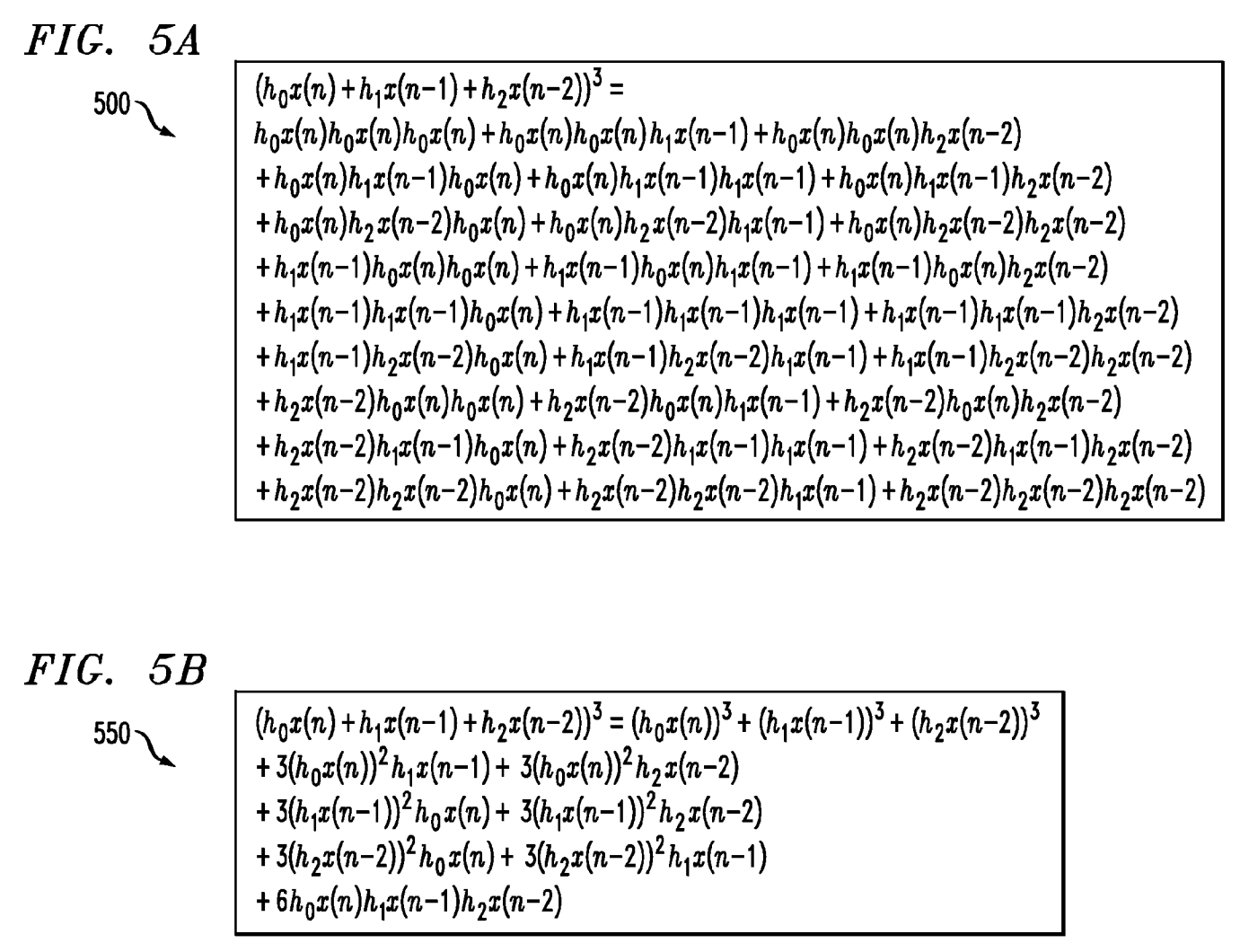

FIGS. 5A and 5B illustrate an exemplary Volterra Series V up to degree K=3 (i.e., up to cubic non-linearity) and a memory depth of three. In FIG. 5A, the exemplary Volterra Series V is comprised of a plurality of terms 500. In FIG. 5B, the exemplary Volterra Series V has been simplified to a reduced set of terms 550.

FIG. 6 illustrates the set 600 of monomial cross-products of degree K. For example, for a representation of cubic non-linearity, there are 10 monomial terms and for quadratic non-linearity, there are six monomial terms. In addition, FIG. 6 also illustrates the computation of the total number $N_3$ of cubic terms for an arbitrary memory depth M for the cubic monomial cross-products 610. As shown in FIG. 6, for the cubic monomial terms 610, and a memory depth M=3, there are a total number of cubic terms $N_3$ 620 equal to $M-M*(M-1)-1$, or $M^2+1$. Thus, for memory depths of 3, 4, 8 and 16, the total number of cubic terms $N_3$ 620 is obtained as follows:

$N_3(3) = 10$ $N_3(4) = 17$ $N_3(8) = 65$ $N_3(16) = 257$

Orthogonal Coefficient Set

The matrix H with coefficients h(k,n) k=0:9 (number of terms) and n=0:2 (memory depth) is desired, such that the cubic and quadratic matrices $C_3$ and $C_2$ are rank 10 and 6, respectively:

Again, consider the 6 quadratic monomial cross-product terms $C_2$ and the 10 cubic monomial cross-product terms $C_3$ in set 600 of FIG. 6. By choosing random coefficients for the matrix H, many options for such a coefficient set are available. For example, consider the following exemplary matrix H:

$$H = \begin{bmatrix} -0.5659 & 2.1003 & -0.8363 \\ -1.4290 & 0.3618 & 0.9145 \\ -1.5463 & -0.2833 & -0.2173 \\ -1.1377 & 1.1058 & 0.6942 \\ 0.3931 & -2.0013 & 0.1485 \\ 0.6690 & -.02869 & -0.7326 \\ 0.9256 & -0.6529 & -1.2819 \\ 1.4090 & -0.2404 & 0.2791 \\ 1.1766 & -0.5525 & 1.3340 \\ -0.8637 & 0.1246 & -0.6768 \end{bmatrix}$$

For the above exemplary matrix H, the determinant can be evaluated to determine if the corresponding rows of the matrix C are linearly independent. For the above exemplary matrix H, the determinant is non-zero for both the cubic and quadratic terms $C_3$ and $C_2$.

$\det(C_2) = -52.7084 \neq 0$ $\det(C_3) = 3.3571 \times 10^4 \neq 0$

It is noted that Fourier coefficients determinants are always equal to 0 and thus are not a good choice as coefficients for the matrix H.

Figure 7:
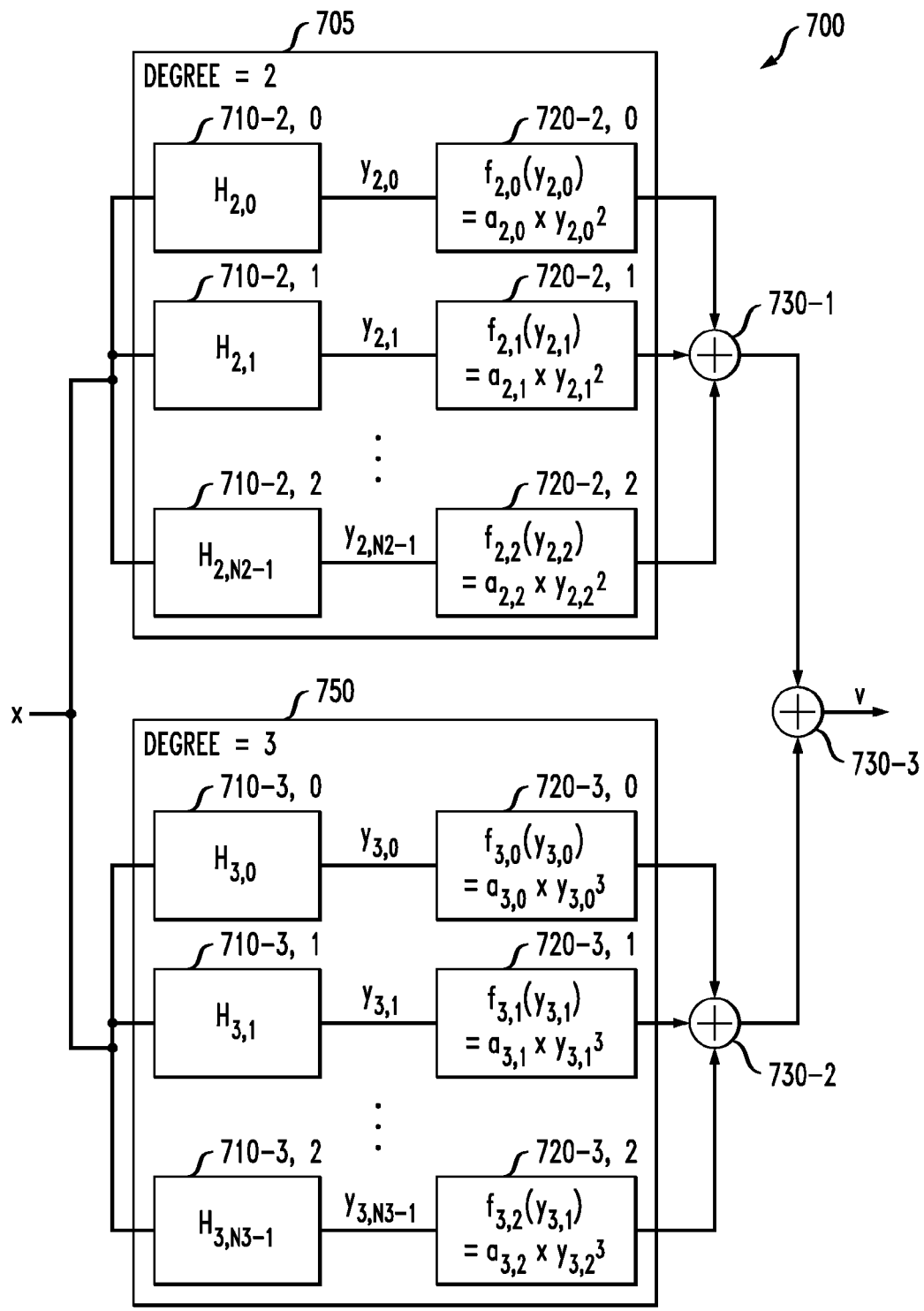
FIG. 7 illustrates the quadratic and cubic terms for an exemplary parallel Weiner decomposition.

FIG. 7 illustrates the quadratic and cubic terms for an exemplary parallel Weiner decomposition 700. For ease of illustration, the DC term, linear terms, and degrees higher than cubic have been omitted from FIG. 7. As shown in FIG. 7, the exemplary parallel Weiner decomposition 700 comprises a quadratic portion 705 of degree two and a cubic portion 750 of degree three.

As shown in FIG. 7, the exemplary quadratic portion 705 of the parallel Weiner decomposition 700 comprises a plurality of linear filters 710-2,0 through 710-2,2 in series with a corresponding static non-linear function 720-2,0 through 720-2,2. Likewise, the exemplary cubic portion 750 of the parallel Weiner decomposition 700 comprises a plurality of linear filters 710-3,0 through 710-3,2 in series with a corresponding static non-linear function 720-3,0 through 720-3,2.

As shown in FIG. 7, three exemplary adders 730-1 through 730-3 perform a linear combination of the outputs of the static non-linear functions 720, to produce the output v of the parallel Weiner decomposition 700.

As noted above, additional aspects of the invention recognize that a number of the DC, linear, quadratic and cubic terms can share one or more filters and/or look-up tables (LUTs) in the exemplary parallel Weiner decomposition.

Figure 8:
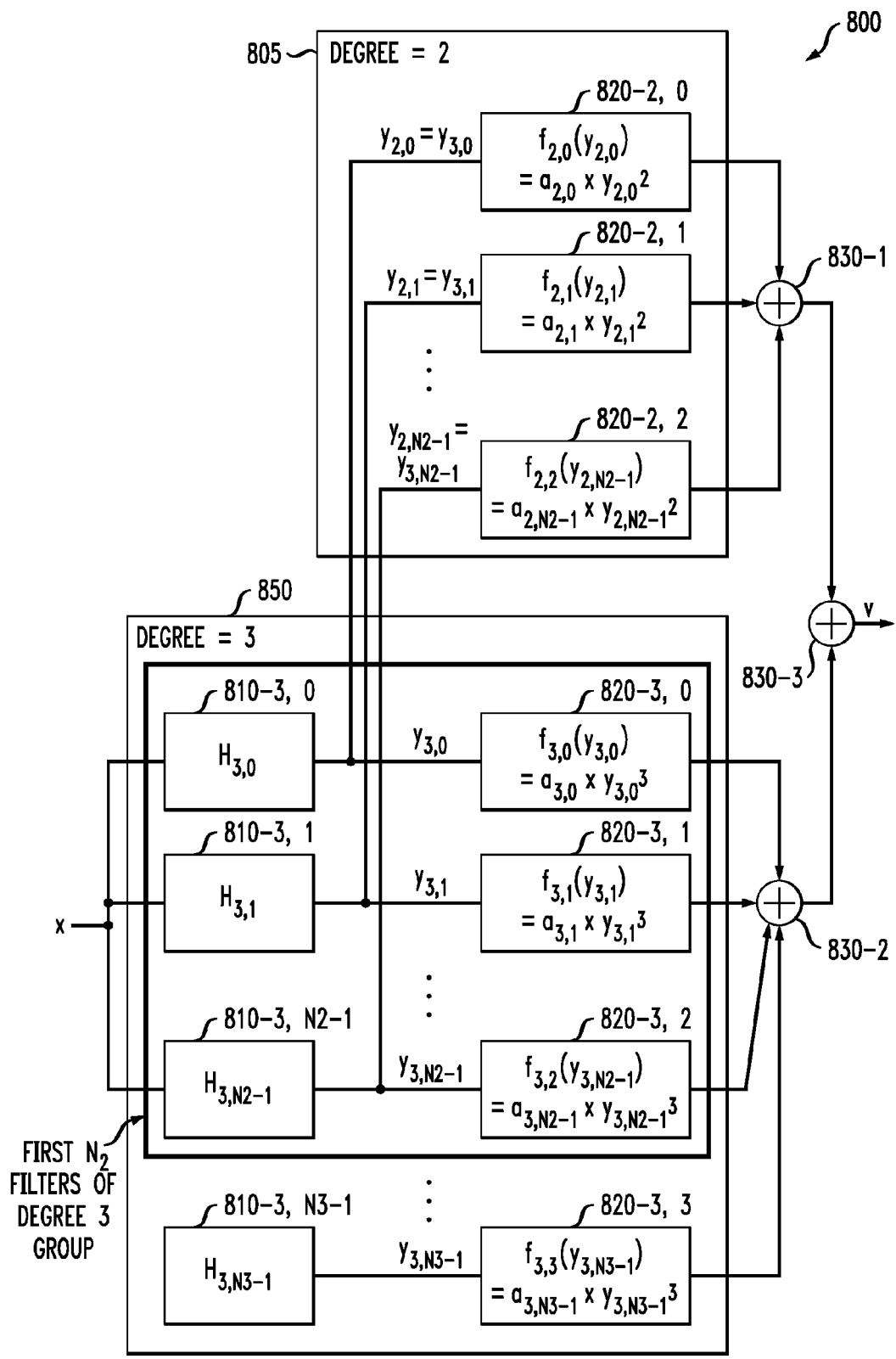
FIG. 8 is a schematic block diagram of an exemplary parallel Weiner decomposition that incorporates a sharing of one or more filters between the exemplary quadratic and cubic terms.

FIG. 8 is a schematic block diagram of an exemplary parallel Weiner decomposition 800 that incorporates a sharing of one or more filters between the exemplary quadratic and cubic terms. As shown in FIG. 8, the exemplary cubic portion 850 of the parallel Weiner decomposition 800 includes a plurality of linear filters 810-3,0 through 810-3, $N_3$-1 that are also shared by the exemplary quadratic portion 805.

As shown in FIG. 8, the exemplary quadratic portion 805 of the parallel Weiner decomposition 800 comprises a plurality of static non-linear functions 820-2,0 through 820-2,2. Likewise, the exemplary cubic portion 850 of the parallel Weiner decomposition 800 also comprises a plurality of static non-linear function 820-3,0 through 820-3,3.

As shown in FIG. 8, three exemplary adders 830-1 through 830-3 perform a linear combination of the outputs of the static non-linear functions 820, to produce the output v of the parallel Weiner decomposition 800. It is noted that $N_2 < N_3$. Thus, there are more filters needed for degree 3 than for degree 2. Therefore, only the $N_2$ first filters in portion 850 are used for degree 3.

Figure 9:
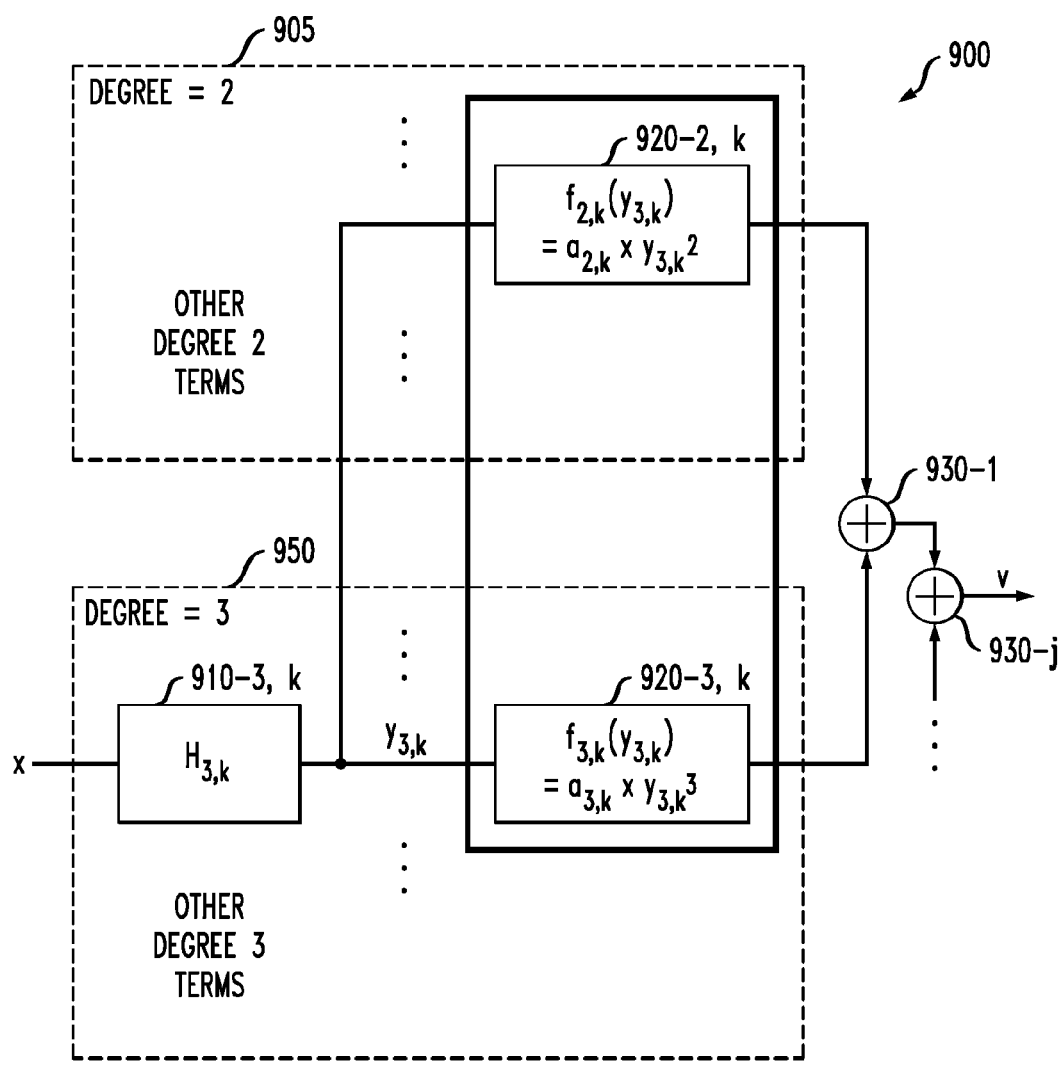
FIG. 9 is a schematic block diagram of an exemplary parallel Weiner decomposition that incorporates a sharing of one or more look-up tables between the exemplary quadratic and cubic terms.
Figure 15:
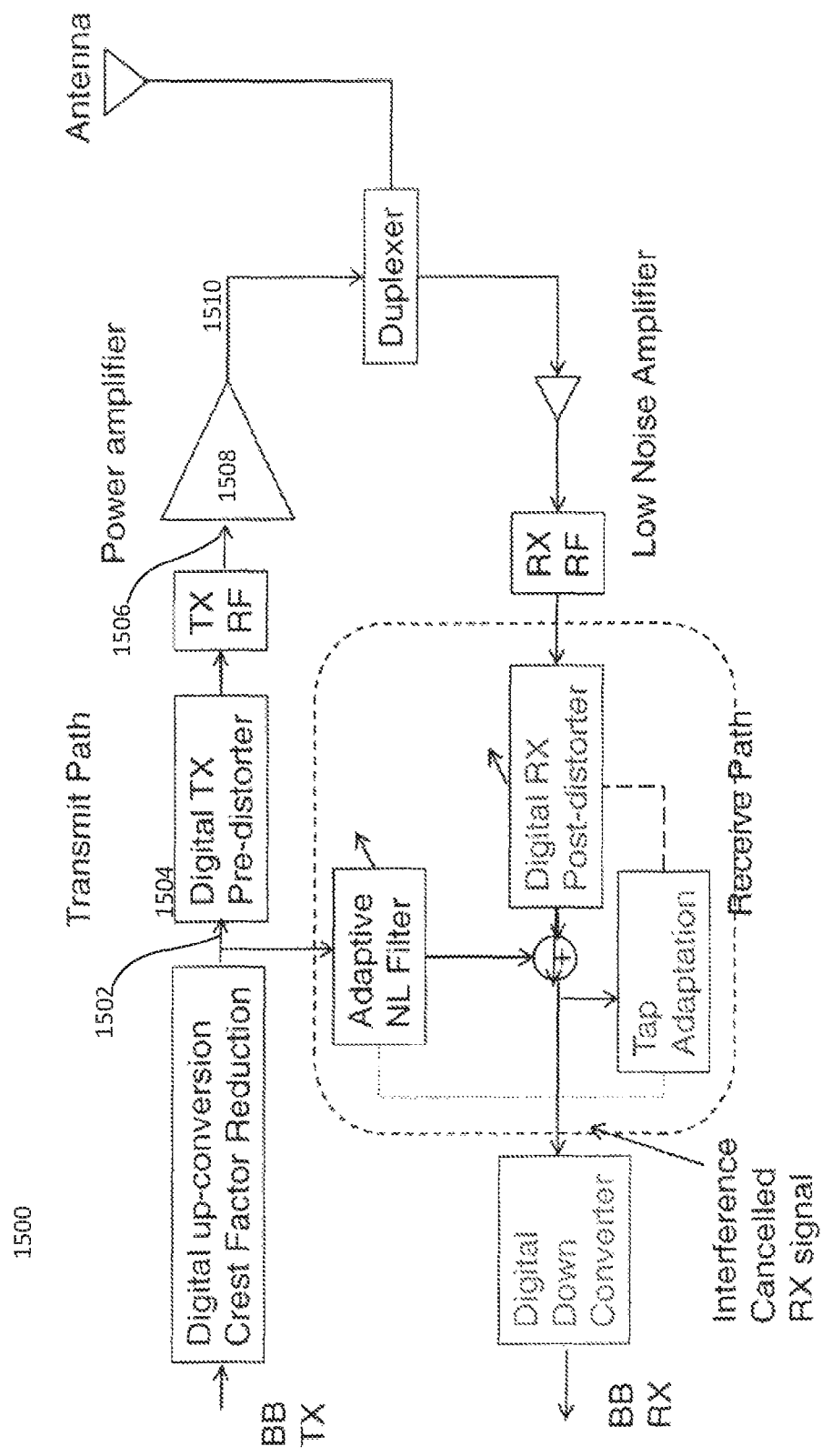
FIG. 15 show a configuration of a wireless communication system.

FIG. 9 is a schematic block diagram of an exemplary parallel Weiner decomposition 900 that incorporates a sharing of one or more look-up tables between the exemplary quadratic and cubic terms. As shown in FIG. 9, the exemplary cubic portion 950 of the parallel Weiner decomposition 900 includes an exemplary linear filter 910-3,k. In addition, the exemplary parallel Weiner decomposition 900 comprises two exemplary static non-linear functions 920-2,k and 920-3,k that can be replaced with a single look-up table 960 that is a sum of the two look-up tables, as follows:

$$f_{3,k}(y_{3,k}) = a_{2,k} \times y_{3,k}^2 + a_{3,k} \times y_{3,k}^3.$$

Orthogonal Weiner Decomposition for Complex Signals

It is noted that in the complex case there are no even order terms because they fall out of the RF band of interest.

Figures 10A, 10B:
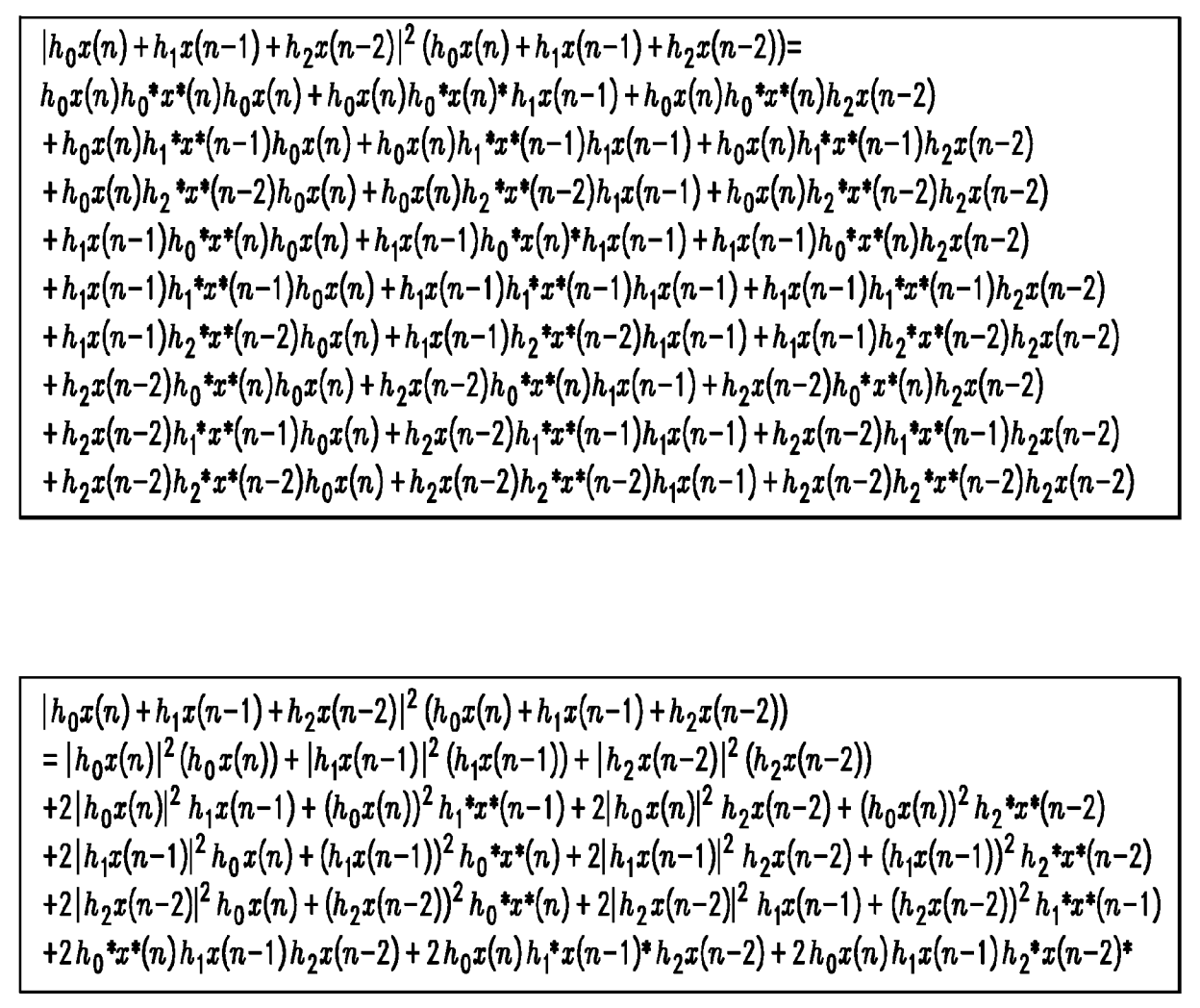

FIGS. 10A and 10B illustrate an exemplary Volterra Series V up to degree K=3 (i.e., up to cubic non-linearity) and a memory depth of three, for complex signals. In FIG. 10A, the exemplary Volterra Series V is comprised of a plurality of terms 1000. In FIG. 10B, the exemplary Volterra Series V has been simplified to a reduced set of terms 1050. It is noted that $|x|^2 x = x \cdot x^* \cdot x$.

FIG. 11 illustrates a computation of a number of cubic terms for a set 1100 of monomial cross-products up to cubic degree, corresponding to the reduced set of terms 1050 of FIG. 10. For an exemplary representation of cubic non-linearity and a memory depth of three, there are 18 monomial terms. In addition, FIG. 11 also illustrates the computation of the total number $N_3$ of cubic terms for an arbitrary memory depth M for the cubic monomial cross-products 1100. As shown in FIG. 11, for the cubic monomial terms 1100, and a memory depth M=3, there are a total number of cubic terms $N_3$ 1120 equal to $M+2M^*(M-1)+M$, or $2M^2$. Thus, for exemplary memory depths of 3, 4, 8 and 16, the total number of cubic terms $N_3$ 1120 is obtained as follows:

$N_3(3) = 18$ $N_3(4) = 32$ $N_3(8) = 128$ $N_3(16) = 512$

It is noted that for the following expression, $h_i h_j h^*_k$, it can be shown that i and j are commutable, i and k are commutable if i=k, and j and k are commutable if j=k.

Orthogonal Coefficient Set

The matrix H with coefficients $h(k,n)$ $k=0:N_3-1$ and $n=0:M-1$ (memory depth) is desired, such that the exemplary cubic matrix $C_3$ is full rank.

Again, consider the 18 cubic monomial cross-product terms $C_3$ in set 1100 of FIG. 11 in two sets, as follows:

$$C_3(k,0:8) = \lfloor |h_{k,0}|^3 \ |h_{k,1}|^3 \ |h_{k,2}|^3 \ |h_{k,0}|^2 h_{k,1} \ h_{k,0}^2 h^*_{k,1} \ |h_{k,0}|^2 h_2 \ h_{k,0}^2 h^*_{k,2} \ |h_{k,1}|^2 h_{k,0} \ h_{k,1}^2 h^*_{k,0} \rfloor$$

$$C_3(k,9:17) = \lfloor |h_{k,1}|^2 h_{k,2} \ h_{k,1}^2 h^*_{k,2} \ |h_{k,2}|^2 h_{k,0} \ h_{k,2}^2 h^*_{k,0} \ h_{k,2}^2 h_{k,1} \ h_{k,2}^2 h^*_{k,1} \ 2h^*_{2,0} h_{2,1} h_{k,2} \ 2h_{k,0} h^*_{k,1} h_{k,2} \ 2h_{k,0} h_{k,1} h^*_{k,3} \rfloor$$

Figures 12A, 12B:
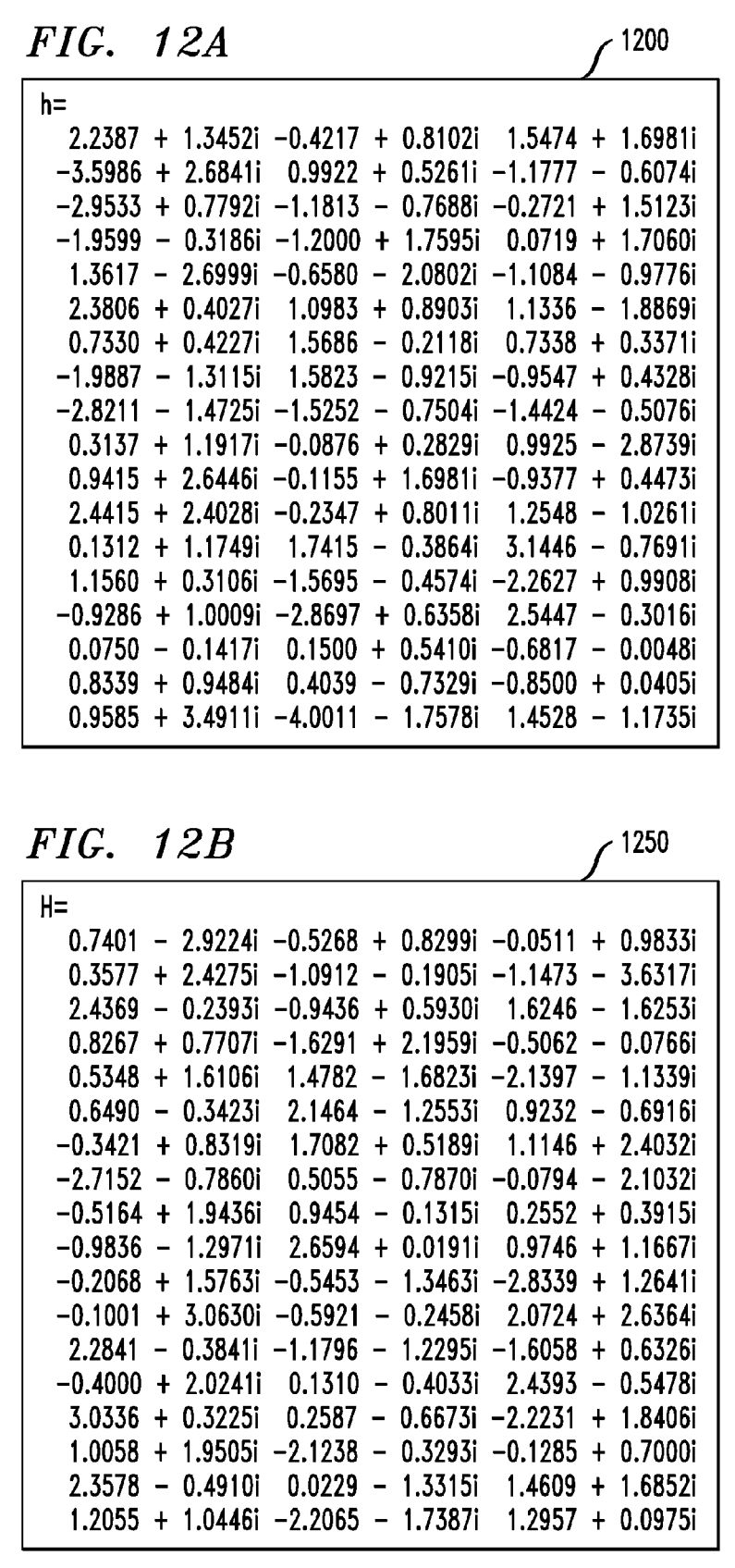

By choosing random coefficients for the matrix H, many options for such a coefficient set are available. FIG. 12A illustrates an exemplary matrix H 1200. For the exemplary matrix H 1200 in FIG. 12A, the determinant can be evaluated to determine if the corresponding rows of the matrix C are linearly independent. For the above exemplary matrix H 1200, the determinant is non-zero for the cubic terms $C_3$:

$$\det(C_3) = 7.0153 \times 10^{22} + j1.6810 \times 10^{23} \neq 0$$

It is noted that real coefficients yields a singular $C_3$ matrix, as elements such as $|h_{k,0}|^2 h_{k,1}$ and $h_{k,0}^2 h^*_{k,1}$ cannot be distinguished from one another. It is again noted that Fourier coefficients determinants are always 0 and thus not a good choice.

FIG. 12B illustrates an alternate exemplary matrix H 1250. According to a further aspect of the invention, the coefficients in matrix H can be optimized by evaluating a large set of randomly chosen (normal distribution) set of coefficients. A particular set of filter coefficients is selected from the various random sets by evaluating the condition number of the corresponding matrix C. In particular, a particular set of filter coefficients is selected having a lowest condition number $\text{Cond}(C_3)$ for the corresponding matrix C.

The exemplary matrix H 1250 corresponds to a particular set of filter coefficients chosen from various random sets based on a minimum condition number found after $2^{16}$ random selections of 37.2 (for M=3). The random selection of filter coefficients can be performed, for example, using the random matrix generator function of Matlab™.

FIG. 13 illustrates an exemplary selection 1300 of filter coefficients for up to cubic non-linearity. Again, consider the 18 cubic monomial cross-product terms $C_3$ in set 1100 of FIG. 11 in three exemplary sets. FIG. 13 illustrates three exemplary groups of filter coefficients coefficients h(0 ... 5), h(6 ... 11) and h(12 ... 17) that correspond to the 18 cubic monomial cross-product terms $C_3$ in set 1100 of FIG. 11.

The determinant is non-zero $\det(C_3) \approx -107 \ j \neq 0$. Thus, the rows of $C_3$ are linearly independent. In addition, the condition number of $C_3$ (cond $(C_3) \approx 26$) is low, thus the filter coefficients coefficients h(0 ... 5), h(6 ... 11) and h(12 ... 17) is a good choice.

FIG. 14 illustrates an exemplary selection 1400 of filter coefficients for up to to quadratic non-linearity. Consider the following 6 quadratic monomial cross-product terms $C_2$:

$$\lfloor |h_0|^2 h_0 \ |h_1|^2 h_1 \ |h_0|^2 h_1 \ h_0^2 h^*_1 \ |h_1|^2 h_0 \ h_1^2 h^*_0 \rfloor$$

Thus, for an exemplary set of filter coefficients 1410, each row 1420-$i$ of the matrix C can be obtained by evaluating the 6 quadratic monomial cross-product terms $C_2$ using the exemplary coefficient values in matrix 1410.

The determinant is non-zero (det(C)=−1.1250+j0.3750≠0). Thus, the rows 1420 of C are linearly independent.

It is noted that the 6 quadratic monomial cross-product terms $C_2$ are obtained from the following expressions:

$$x(n)+jx(n-1)$$

$$x(n)-0.5x(n-1)$$

$$jx(n)+x(n-1)$$

$$-0.5x(n)+x(n-1)$$

Construction of Static Non-Linear Models (Complex)

Suppose the target Volterra series has the following cubic coefficients:

$$V_3 = [v_{3,0}\ v_{3,1}\ v_{3,2} \ldots v_{3,16}\ v_{3,17}]$$

The determinant $\det(C_3)$ is non-zero. Thus, the rows of $C_3$ are linearly independent.

Therefore, there exist coefficients $a(3,0), \ldots, a(2,17)$ such that:

$$V_3 = \sum_{k=0}^{N_3-1} a_{3,k} C_3(k, .)$$

This can be written in a matrix form:

$$V_3 = A_3 C_3$$

The coefficients are given by:

$$A_3 = V_3 C_3^{-1}$$

The Voterra series can be written as:

$$V = V_1 X_1^T + V_3 X_3^T + \ldots$$

$$= \sum_{i=0}^{\infty} \sum_{k=0}^{N_{2i+1}-1} a_{2i+1,k} C_{2i+1}(k, .) X_{2i+1}^T$$

$$= \sum_{i=0}^{\infty} \sum_{k=0}^{N_{2i+1}-1} a_{2i+1,k} |H(k, .)X^T|^{2i} (H(k, .)X^T)$$

where:

$$X_3 = [|x_n|^3\ |x_{n-1}|^3\ |x_{n-2}|^3\ |x_n|^2 x_{n-1}\ x_n^2 x^*_{n-1}\ |x_n|^2 x_{n-2}$$
$$x_n^2 h^*_{n-2}\ |x_{n-1}|^2 x_n\ x_{n-1}^2 x^*_n\ |x_{n-1}|^2 x_{n-2}\ x_{n-1}^2 x^*_{n-2}$$
$$x_{n-1}^2 x^*_{n-2}\ |x_{n-2}|^2 x_n\ x_{n-2}^2 x_n^*\ |x_{n-2}|^2 x_{n-1}$$
$$x_{n-2}^2 x^*_{n-1}\ 2x^*_n x_{n-1} x_{n-2}\ 2 x_n x^*_{n-1} x_{n-2}$$
$$2 x_n x_{n-1} x^*_{n-2}]$$

$$X = [x_n\ x_{n-1}\ x_{n-2}]$$

$$H(k, .) = [h_{k,0}\ h_{k,1}\ h_{k,2}]$$

Thus, $$V = \sum_{i=0}^{K} \sum_{k=0}^{N_i-1} a_{2i+1,k} |y_k|^{2i} y_k$$

$$= \sum_{k=0}^{N_k-1} f_k(|y_k|) \cdot y_k$$

where the static polynomial function can be expressed as follows:

$$f_k(|y|) = \sum_{i=0}^{K} a_{2i+1,k} |y|^{2i}$$

Thus, for a given H, the Volterra series has an equivalent representation 100, as shown in FIG. 1.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

I claim:

1. A method for a digital pre-distortion (DPD) circuit to generate an inverse distortion, the method comprising:

obtaining a target from an input, the target modeled as a target Volterra Series V comprising a plurality of terms up to degree K;

providing a parallel Wiener decomposition representing said target Volterra Series V, wherein said parallel Wiener decomposition comprises a plurality of linear filters in series with at least one corresponding static non-linear function, wherein the input signal is applied to said plurality of linear filters and wherein outputs of non-linear functions are linearly combined to produce an output of said parallel Wiener decomposition;

computing a matrix C for a given degree up to said degree K, wherein a given row of said matrix C corresponds to one of said linear filters and is obtained by enumerating monomial cross-products of coefficients of said corresponding linear filter for said given degree;

determining filter coefficients for at least one of said plurality of linear filters, such that the rows of said matrix C are linearly independent; and generating the inverse distortion based on the determined filter coefficients.

2. The method of claim 1, further comprising computing a vector A comprising coefficients that perform said linear combination of said outputs of said plurality of static non-linear functions.

3. The method of claim 2, further comprising determining at least one of said static non-linear functions based on said vector A.

4. The method of claim 2, wherein said vector A is obtained by multiplying said target Volterra Series V by an inverse of said matrix C.

5. The method of claim 1, wherein one or more of said plurality of linear filters are shared by a plurality of degrees of said representation of said target Volterra Series V.

6. The method of claim 1, wherein one or more of said static non-linear functions are shared by a plurality of degrees of said representation of said target Volterra Series V.

7. The method of claim 1, wherein said determining filter coefficients for at least one of said plurality of linear filters further comprises evaluating a linear independence of said rows of said matrix C.

8. The method of claim 7, wherein said determining filter coefficients for at least one of said plurality of linear filters further comprises evaluating a condition number of said matrix C.

9. The method of claim 1, wherein at least one of said static non-linear functions is implemented using at least one look-up table.

10. The method of claim 9, wherein said at least one look-up table comprises entries obtained by evaluating a mean square error.

11. The method of claim 9, wherein said at least one look-up table comprises entries obtained using one or more of a least squares algorithm, recursive least squares (RLS) and least mean square (LMS).

12. The method of claim 9, wherein said at least one look-up table employs linear interpolation between two consecutive values of said at least one look-up table to approximate said at least one static non-linear function.

13. A digital pre-distortion (DPD) circuit configured to generate an inverse distortion, the inverse distortion modeled on a target Volterra Series comprising a plurality of terms up to degree K, the DPD circuit comprising:
a parallel Wiener decomposition circuit comprising a plurality of linear filters in series with at least one corresponding static non-linear function, wherein an input signal is applied to said plurality of linear filters; and
a linear combiner for combining an output of said static non-linear functions to produce an output of said parallel Wiener decomposition circuit, wherein filter coefficients for at least one of said plurality of linear filters corresponding to a given row of a matrix C for a given degree up to said degree K ensure that said given row of said matrix C is linearly independent, wherein said given row of said invertible matrix C is obtained by enumerating monomial cross-products of coefficients of said corresponding linear filter for said given degree,
wherein the DPD circuit is configured to generate the inverse distortion based on the combining of the output of said static non-linear functions.

14. The digital pre-distortion (DPD) circuit of claim 13, further comprising circuitry configured to compute a vector A comprising coefficients that perform said linear combination of said outputs of said plurality of static non-linear functions.

15. The digital pre-distortion (DPD) circuit of claim 14, wherein at least one of said static non-linear functions are based on said vector A.

16. The digital pre-distortion (DPD) circuit of claim 13, wherein one or more of said plurality of linear filters are shared by a plurality of degrees of said representation of said target Volterra Series V.

17. The digital pre-distortion (DPD) circuit of claim 13, wherein one or more of said static non-linear functions are shared by a plurality of degrees of said representation of said target Volterra Series V.

18. The digital pre-distortion (DPD) circuit of claim 13, wherein rows of said matrix C are linearly independent.

19. The digital pre-distortion (DPD) circuit of claim 13, wherein at least one of said static non-linear functions is implemented using at least one look-up table.

20. The digital pre-distortion (DPD) circuit of claim 19, wherein said at least one look-up table employs linear interpolation between two consecutive values of said at least one look-up table to approximate said at least one static non-linear function.

* * * * *